United States Patent [19]

Tailliet

[11] Patent Number: 5,774,390
[45] Date of Patent: Jun. 30, 1998

[54] DIGITAL RAMP GENERATOR

[75] Inventor: François Pierre Tailliet, Epinay Sur Seine, France

[73] Assignee: SGS-Thomson Microelectronics S.A., Saint Genis, France

[21] Appl. No.: 652,710

[22] Filed: May 30, 1996

[30] Foreign Application Priority Data

May 31, 1995 [FR] France .................................. 95 06498

[51] Int. Cl.$^6$ ................................ G06G 7/00; G06J 1/00
[52] U.S. Cl. ........................................... 364/807; 364/607
[58] Field of Search .................................... 364/807, 607, 364/715.01

[56] References Cited

U.S. PATENT DOCUMENTS 5,315,547   5/1994   Shoji et al. .............................. 365/185

OTHER PUBLICATIONS

IEEE Transactions on Consumer Electronics, vol. 38, No. 4, Nov. 1992 New York, US, pp. 824–829 Yoshioka, et al., "The Development Of A Memory Card For A Digital Still Camera Using a 5Mbit NAND EEPROM".

EDN Electrical Design News, vol. 17, No. 19, Oct. 1, 1972 Newton, MA, US, pp. 48–49, Edwin E. Morris "Simple Stair Generator Uses 1 IC and 3 Transistors".

*Primary Examiner*—Tan V. Mai
*Attorney, Agent, or Firm*—Wolf, Greenfield & Sacks, P.C.; James H. Morris

[57] ABSTRACT

A digital ramp generator including a controlled sampling circuit receiving an input voltage, an adding circuit for adding the said input voltage to an actual output voltage to provide a new voltage which is greater than the said input voltage, and a voltage follower circuit receiving the new voltage and providing a new output voltage corresponding to the new voltage which is greater than the said actual output voltage.

29 Claims, 5 Drawing Sheets

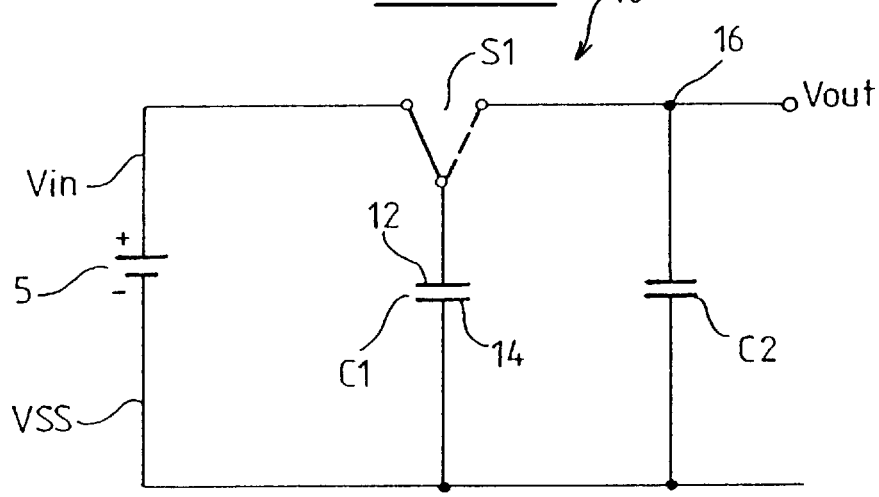
FIG_1a
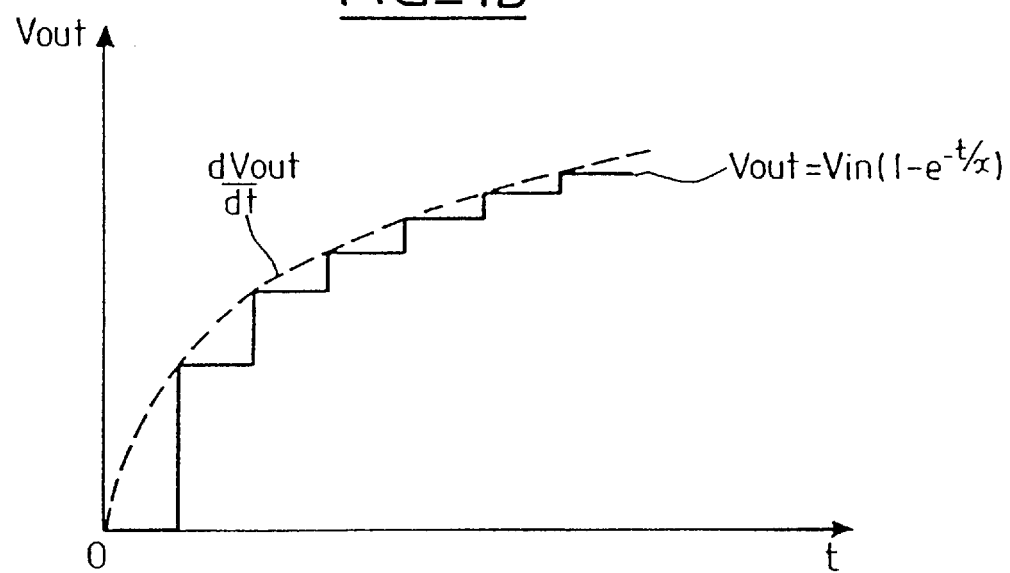
FIG_1b

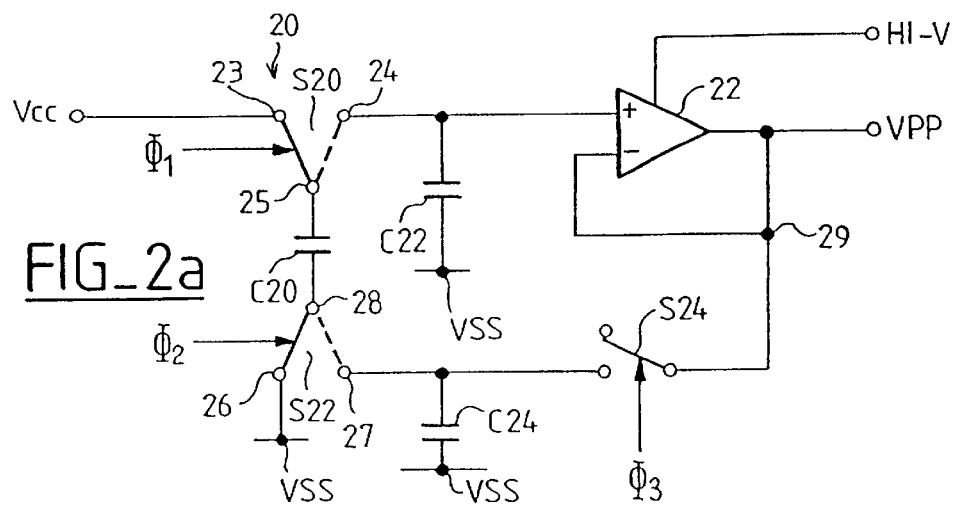
FIG_2a
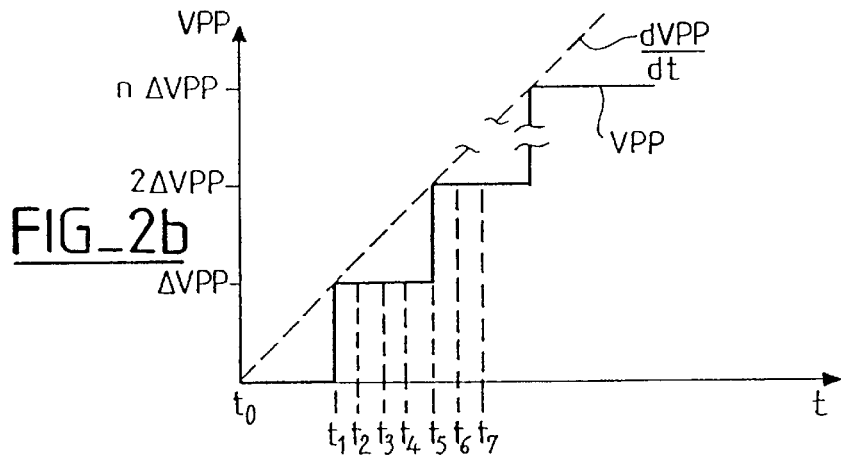
FIG_2b
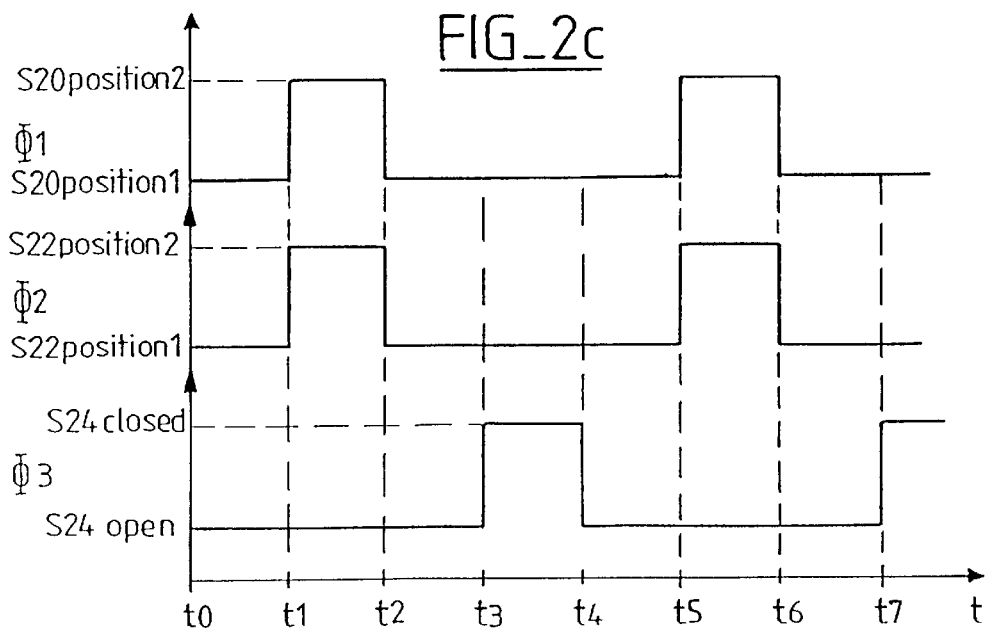
FIG_2c

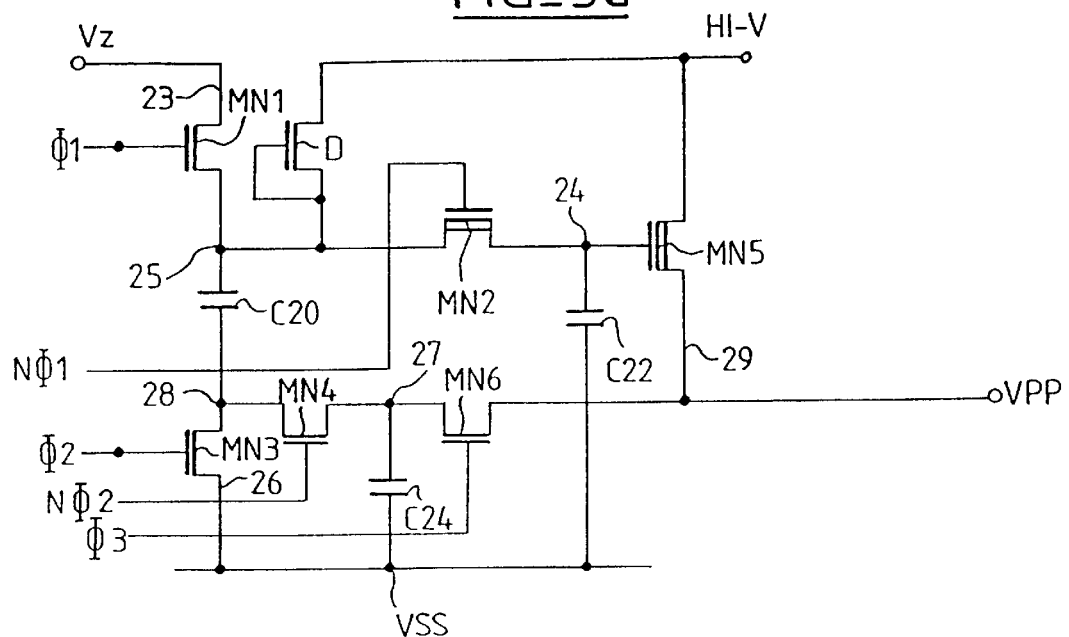
FIG_3a
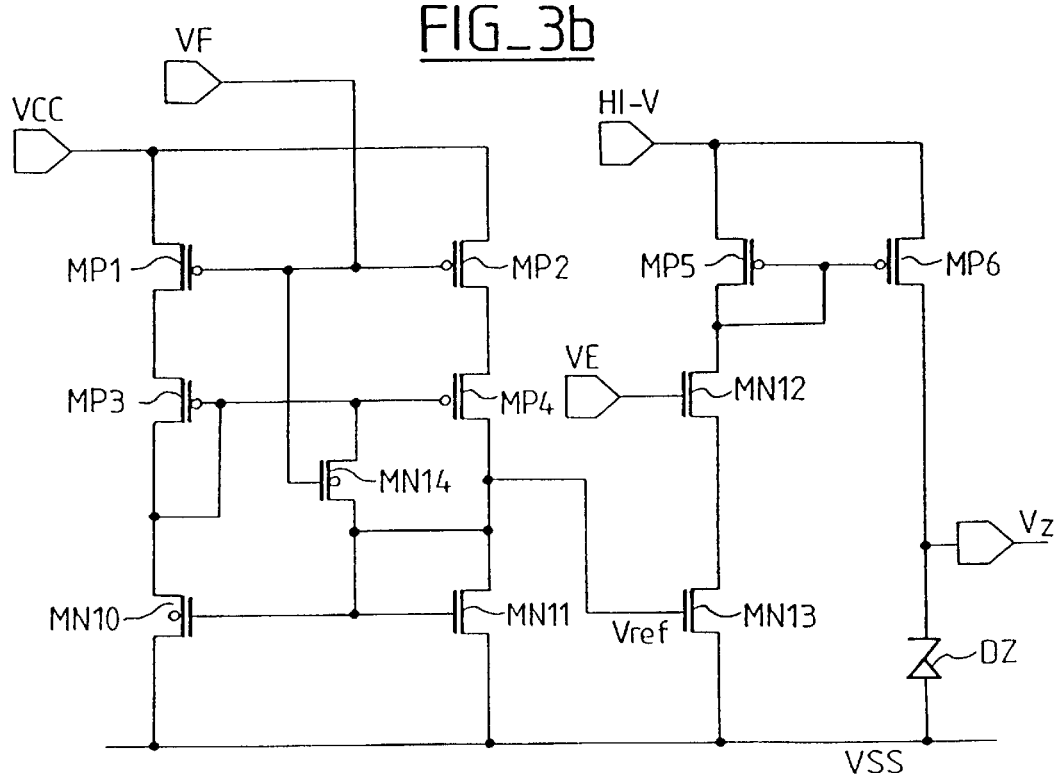
FIG_3b

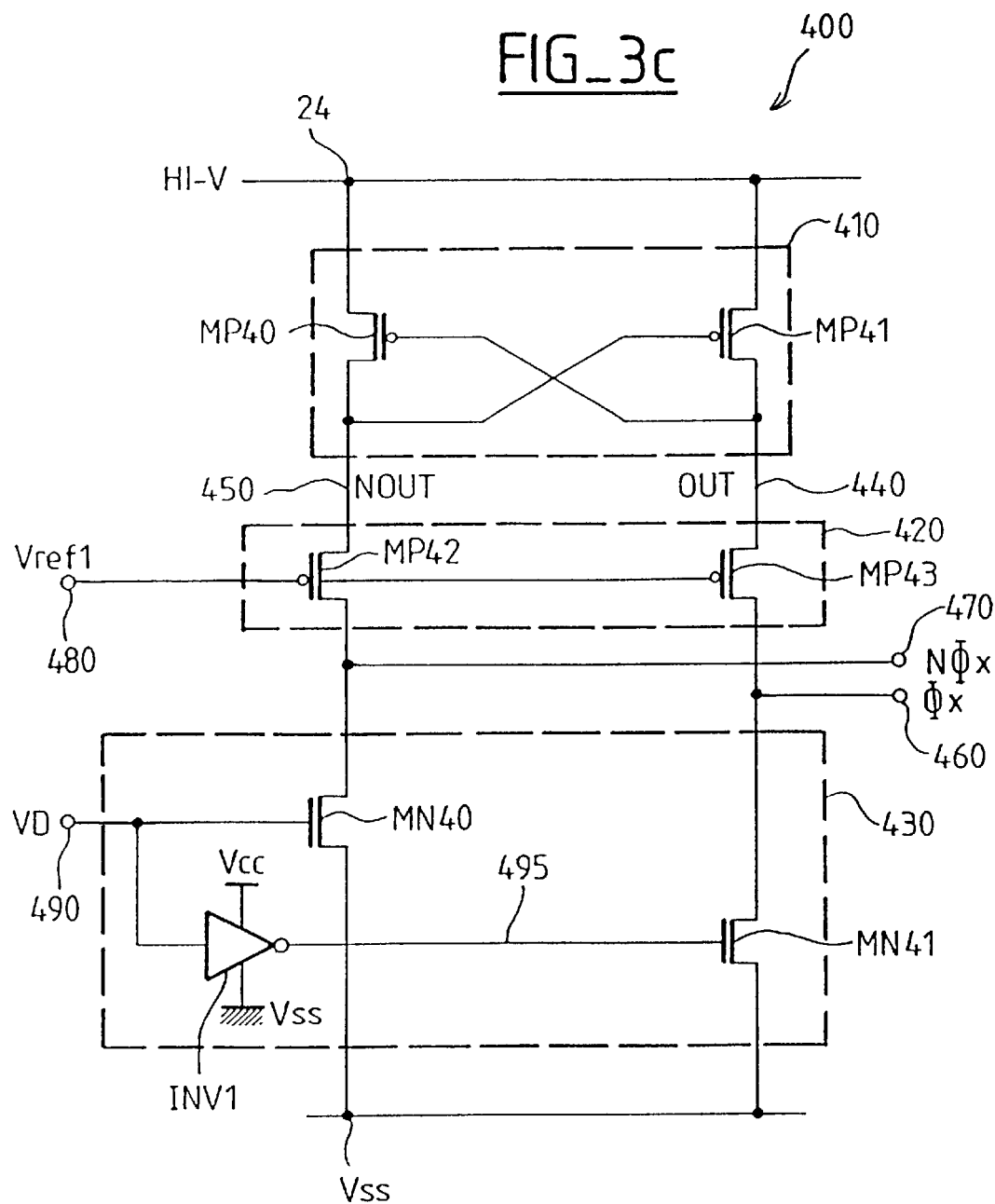

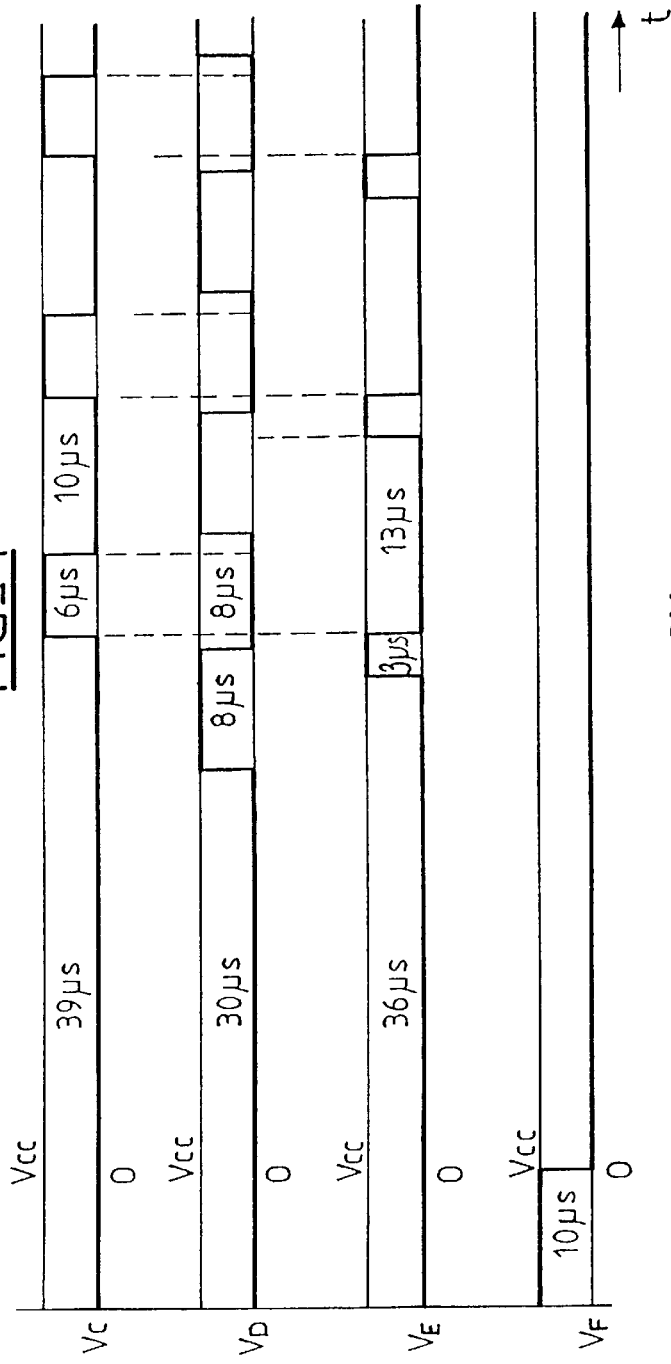
FIG_4
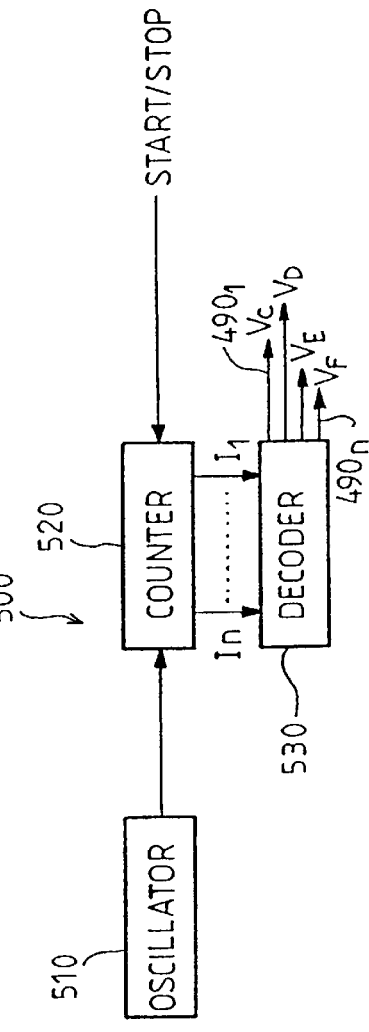
FIG_5

DIGITAL RAMP GENERATOR

BACKGROUND OF THE INVENTION

1. Field of the Invention

The present invention relates to a digital ramp generator. More particularly, the present invention relates to a circuit that provides a substantially linear output voltage that can be used, for example, to program electrically programmable memories in integrated circuit form.

2. Discussion of the Related Art

The programming of electrically programmable memories in integrated form, generally known as EPROMs or EEPROMs or flash EEPROMs if they are erased in blocks, is known to those skilled in the art. These memories are programmed using a high voltage HI-V that sometimes is derived from the normal voltage supply Vcc of the circuit and that sometimes is derived from a high voltage supplied by an external circuit. In the first case a circuit, conventionally referred to as a charge pump is used to produce a high voltage HI-V within the integrated circuit.

Furthermore, it is known in the art that the true programming voltage VPP is derived from the high voltage within the integrated memory itself. The voltages HI-V or VPP are of the order of 15v or more, whereas the voltage Vcc, from which the voltage VPP may be derived, is less than the voltage VPP. For example, the voltage Vcc can have a typical value within the range of 1.5v to 5v. While the HI-V voltage is intended to have a high value, the VPP voltage should provide for a linear ramp followed by a regulated plateau at this high value. Typically the duration of the ramp is 500 microseconds while the duration of the plateau is of the same order.

One of the problems associated with the programming of the above mentioned memories is that increasing the programming voltage VPP too rapidly during the ramp substantially reduces the lifetime of the memory cells because the rising edge of the voltage VPP is directly applied to the memory cells during programming. Too rapid an increase of the voltage VPP causes too strong a tunnel current in the gate oxides of the floating-gate transistors that constitute the memory cell. This oxide may be deteriorated. To avoid these problems, an analogical survey of the ramp is provided. One solution of this type is proposed in the U.S. Pat. No. 5,175,706 Edme.

Contemporary charge pumps used to generate the programming voltage HI-V all produce a rate of change of this voltage i.e. dHI-V/dt, that is not constant. As this rate dHI-V/dt is not constant, HI-V may not be used in itself as a true VPP voltage. HI-V would tend to stress the memory cells during the initial increase of the voltage HI-V. Particularly, the step change in the voltage HI-V at the start of its increase is greater than the step change towards the end of its increase. The non-linearity of dHI-V/dt is due to the fact that the output voltage of the conventional charge pump circuit follows an envelope that is exponential in nature.

FIG. 1a illustrates schematically a charge pump circuit 10. This charge pump circuit 10 includes a voltage supply 5, providing a Vin voltage, a Single-Pole-Double-Throw switch S1 and first and second capacitors C1, C2.

In order to highlight this non-linearity problem, consider time t(n), when switch S1 is its first position, indicated by a continuous line, connecting capacitor C1 to voltage supply 5. The first plate 12 of capacitor C1 is connected through switch S1 to the positive voltage terminal Vin of the voltage supply 5. The second plate 14 of capacitor C1 is permanently connected to the negative voltage terminal VSS of the voltage supply 5. The second capacitor C2, which is isolated from capacitor C1, has its first and second plates connected between an output terminal 16 of the charge pump circuit 10 and the negative voltage terminal VSS. The output terminal 16 supplies the output voltage Vout. Thus, at time t(n), capacitor C1 charges to the voltage value Vin, assuming VSS is ground referenced, i.e. 0v. During this period, capacitor C2 supports the voltage Vout(n) and the total charge stored by capacitors C1 and C2 is given by Qt(n)= [C1.Vin+C2.Vout (n)].

Now at time t(n+1), switch S1 changes from its first position to its second position; the second position being indicated by dashed lines. Capacitors C1 and C2 are now connected in parallel between the output terminal 16 and the negative voltage terminal VSS and both capacitors C1 and C2 are isolated from the voltage supply 5. Thus, the total charge that was stored by capacitors C1 and C2 at time t(n), i.e. Qt(n), is now shared, between capacitors C1 and C2 and as a result, the Vout voltage increases from a value Vout (n) to a value Vout (n+1). From the principle of charge conservation, the following equation is obtained:

$$(C1+C2).Vout(n+1)=(C1.Vin)+(C2).Vout(n); \text{ therefore}$$

$$[Vout(n+1)-Vout(n)]=[C1/(C1+C2)].[Vin-Vout(n)] \quad \text{equation 1}$$

From equation 1, it can be seen that the left hand term [Vout(n+1)−Vout(n)] decreases with time due to the right hand Vout(n) term approaching Vin.

FIG. 1b illustrates a graphical representation of the rate of change of the programming voltage Vout as a function of time, i.e. dVout/dt. It should be noted that the initial step changes in the voltage Vout are much greater than the step change in the voltage Vout towards the end of its increase. The dashed line indicates the envelope of the rate of change dVout/dt of the voltage Vout which is given by Vout=Vin (1−exp(−t/x); where x is proportional to [C1+C2]/C1.

It is thus shown that a charge pump circuit does not produce a linear ramp. Even if the supply voltage is high it remains that its ramp is not linear and may not be utilized as such for programming cells of EPROM.

The VPP voltage is produced from an existing HI-V voltage (outside or inside the integrated circuit) by a circuit having a capacitor fed by a constant current source which is supplied by this HI-V voltage. Such a circuit suffers the drawback of being analog and of necessitating measurement of the time when VPP reaches its nominal value, and measurement of VPP plateau duration. This is also achieved by analog circuits which are difficult to set due to characteristic dispersion of their operating parameters.

Accordingly, a general goal of the present invention is to generate a ramp voltage that increases in a gradual controlled manner, the gradual increase of the ramp voltage being substantially linear.

SUMMARY OF THE INVENTION

In order to achieve the above general goal and such other goals as will be apparent to those skilled in this art, the present invention may include a digital ramp generator, that receives, via an input terminal, an input voltage. The ramp generator may provide on an output terminal, a ramp output voltage which pumps said ramp generator via a voltage follower circuit.

According to other embodiments of the present invention, the voltage follower circuit may further include a voltage follower amplifier that receives a ramp voltage on an input terminal and provides a follower voltage that equals said ramp output voltage on an output terminal and a first switch of said voltage follower circuit having an input terminal connected to said output terminal of said voltage follower circuit. A first capacitor is connected between an output terminal of said first switch and a reference voltage terminal. Alternatively, said first switch of said voltage follower circuit may be replaced by a short circuit. Said voltage follower circuit may be fed by a high input voltage on a high input voltage terminal.

According to other embodiments of the present invention said ramp generator may include first and second switches and first and second capacitors. Said first switch of said generator, which acts as a Single-Pole-Double-Throw switch, has a first terminal connected to said input terminal of said generator, a second terminal connected to said input terminal of said voltage follower circuit and a common third terminal connected to one plate of said first capacitor of said generator. Said second switch of said generator, which acts as a Single-Pole-Double-Throw switch, has a first terminal connected to a reference voltage terminal, a second terminal receiving an output from said voltage follower means and a common third terminal connected to a second plate of said first capacitor. Said second capacitor is connected between said second terminal of said first switch and said or another reference voltage terminal. The switching of said first and second switches from respective first terminals to respective second terminals is in unison or is substantially in unison.

In embodiments of the invention including all three switches described above, the first switch of said voltage follower circuit is controlled such that it is closed after said first and second switches of said generator have switched to their respective second terminals and it is opened before said first and second switches of said generator switch to their respective first terminals.

According to other embodiments of the present invention the voltage follower circuit may include a MOS transistor that has a first terminal connected to said high voltage input terminal of said generator. A second terminal of said transistor carries the follower voltage and is connected to the output terminal of said generator. A gate terminal thereof receives a pumped voltage. Alternatively, said voltage follower circuit can include a diode whose anode is connected to said input terminal of said voltage follower circuit of said generator and whose cathode is connected to said high voltage input terminal. Said diode can be implemented using a MOS transistor.

According to other embodiments of the present invention said first and second switches of said generator may be implemented using appropriately connected and controlled MOS transistors.

According to other embodiments of the present invention said MOS transistors may be n-type MOS transistors and are native MOS transistors, i.e. MOS transistors that have had no gate-source threshold adjustments, and thus a conduction threshold value between 0 volt and 0.2 volt.

According to other embodiments of the present invention said first capacitor of said generator has a capacitance less than that of said second capacitor of said generator which in turn has a capacitance less than that of said first capacitor of said voltage follower circuit.

Another embodiment of the present invention controls said ramp output voltage of said generator to be substantially linear.

According to other embodiments of the present invention the digital ramp generator may be implemented on a single semiconductor substrate and said output terminal of said generator is received by a memory, for example, an EEPROM or flash type EEPROM.

According to other embodiments of the present invention a smart card can include a digital ramp generator according to any embodiments of the present invention and likewise, a system including a microcontroller and/or microprocessor can include a digital ramp generator according to any embodiment of the present invention.

The present invention may also provide a digital ramp generator that includes a sampling circuit which receives a first input voltage that is to be sampled so as to obtain a sampled voltage represented by an electric charge and a transmission circuit which receives and transmits the electric charge from the sampling circuit to an output for producing a ramp output voltage. An elevation circuit receives the ramp output voltage and adds it to the sampled voltage. A control circuit controls the sampling, transmission and elevation circuits in phases in which;

a) the sampling of the input voltage takes place during a first time period;

b) a voltage corresponding to the sampled input charge is then added to the input voltage of the elevation circuit during a second time period; and c) the resultant combined voltage is then transmitted by the transmission circuit to the output of the generator.

BRIEF DESCRIPTION OF THE DRAWINGS

The present invention together with its objects, advantages and features will become apparent in the light of the following detailed description of some embodiments thereof and accompanying drawings, that are intended to be non-limiting in which:

FIG. 1a schematically illustrates a basic charge pump circuit;

FIG. 1b graphically illustrates the output voltage Vout of FIG. 1a;

FIG. 2a schematically illustrates a digital ramp generator according to the present invention;

FIG. 2b graphically illustrates the programming voltage of FIG. 2a as a function of time;

FIG. 2c is a timing diagram of the control signals of the three switches as described in relation to FIGS. 2a and 2b;

FIGS. 3a, 3b and 3c are more detailed schematic diagrams of the digital ramp generator of FIG. 2a;

FIG. 4 is a timing diagram of the signals utilized for controlling the circuits of FIGS. 3a to 3c; and FIG. 5 is a block diagram of a control signal generator that is used to produce the signals of FIG. 4.

DETAILED DESCRIPTION

FIG. 2a is a schematic illustration of an embodiment of a digital ramp generator according to the present invention. This digital ramp generator 20 includes two Single-Pole-Double-Throw switches S20 and S22, a Single-Pole-Single-Throw switch S24, three capacitors C20, C22, C24 and a voltage follower 22.

A first terminal of switch S20 designated by node 23 is connected to Vcc, its second terminal is designated by node 24 and its common pole is designated by node 25. In a first position of switch S20, the node 25 is connected to node 23. In a second position the node 25 is connected to node 24. A first terminal of switch S22 is designated by node 26, its second terminal is designated by node 27 and its common pole is designated by node 28. In a first position of switch S22, the node 28 is connected to node 26. In a second position the node 28 is connected to node 27. If node 23 is connected to a Vcc supply input, node 26 is connected to a ground, or VSS, input. Capacitor C22 is connected between node 24 and the reference voltage VSS. Node 24 supplies a ramp voltage. The voltage follower 22 receives this ramp voltage on a first input and provides a ramp output voltage VPP at its output terminal 29. The output terminal 29 is connected to a second input of the voltage follower 22. The voltage follower 22 could be an operational amplifier connected as a follower. The voltage follower 22 power supply is a high input voltage HI-V. Switch S24 is connected in series between nodes 27 and 29 and capacitor C24 is connected between node 27 and the reference voltage VSS. Capacitor C20 is connected between nodes 25 and 28 of switches S20 and S22 respectively. In practice, an unregulated supply or programming voltage HI (not shown) is regulated to its required value HI-V.

The basic operation of the ramp generator 20 according to the invention can be broken down into a series of time intervals. The following description does not take into account the substantially constant and relatively small threshold and switching losses etc. At time t0, (FIG. 2b), it shall be assumed that all the capacitors, C20, C22, C24, are fully discharged, physically isolated from each other, and that the value of capacitor C24 is greater than that of C22, whose value is itself greater than that of C20. Furthermore, switches S20, S22 and S24 will be assumed to be controlled by respective control signals Φ1, Φ2 and Φ3 appearing on FIG. 2c.

FIG. 2b illustrates the programming voltage VPP of FIG. a as a function of time. The rate of change of the programming voltage dVPP/dt is the slope of the dashed line.

Between time $t0 \leq t < t1$, switches S20 and S22 are in their respective first positions, as indicated by a continuous line, and switch S24 is open: thus all three capacitors, C20, C22, C24, are physically isolated from each other. The positive plate 25 of capacitor C20 charges to the voltage value Vcc, assuming that the voltage VSS is ground referenced via switch S22.

At time t1, switches S20 and S22 switch, at, or substantially at, the same instant, from their respective first positions to their respective second positions, as indicated by dashed lines; switch S24 remains open.

Between time t1<t<t2, with switches S20 and S22 in their respective second positions and switch S24 open, capacitors C24 and C20 are now connected in series. Furthermore, this series connection of capacitors C24 and C20 is connected in parallel with capacitor C22. The positive plate 27 of capacitor C24 is connected to the negative plate 28 of capacitor C20. This results in the positive plate 25 of capacitor C20 being brought to a voltage level that is higher than the voltage level VPP formerly available at the output of comparator 22.

However, at the beginning, during that first particular time interval the voltage across capacitor C24 is zero volt. Therefore, no voltage elevation takes place. Nevertheless, from the principle of charge conservation, one can obtain the following equation:

$$dVPP = VPP(t+1) - VPP(t) = [C20/(C20+C22)]Vcc. \quad \text{Equation 2}$$

This equation 2 remains true even for following cycles. It should be noted that equation 2 does not contain a right hand VPP(t) term, unlike equation 1. The absence of the right hand VPP(t) term of equation 2 accounts for the much improved linearity of the slope of the voltage VPP, i.e. dVPP/dt.

Therefore, integrating equation 2 yields:

$$VPP = [C20/(C20+C22)].A.Vcc.t \quad \text{Equation 3}$$

where A is a constant that is proportional to the switching frequency of switches S20 and S22.

As the term voltage follower implies, the follower voltage VPP on the output terminal 29 of the voltage follower 22 follows or tracks the voltage on its input terminal 24. Therefore, since the input terminal of the voltage follower 22 is connected to node 24 and thus receives the voltage VPP, the voltage VPP on the output terminal 29 of the voltage follower 22 substantially equals the voltage given by equation 3.

At time t2, switches S20 and S22 switch from their respective second positions back to their respective first positions; switch S24 remains open. Thus, all three capacitors, C20, C22, C24, are again isolated from each other. Further, capacitor C20 again commences charging to the voltage value Vcc, taking a sample of the voltage value Vcc.

Between time t2<t<t3: switches S20 and S22 are in their respective first positions, the positive plate 25 of capacitor C20 recharges to the voltage value Vcc. Step t2–t3 may be very short as compared to steps t0–t1, t1–t2, or subsequent t3–t4.

At time t3, switches S20 and S22 still remain in their respective first positions, switch S24 closes and connects the output terminal 29 of the voltage follower 22 to the most positive plate 27 of capacitor C24.

Between time t3<t<t4, capacitor C24 is charged by the follower voltage VPP value present on the output terminal 29 of the voltage follower 22, i.e. it charges substantially to the voltage value given by equation 3. The electric charges are coming from the HI-V supply.

At time t4, with switches S20 and S22 still in their respective first positions, switch S24 opens and disconnects the output terminal 29 of the voltage follower 22 from the most positive plate 27 of capacitor C24 which substantially maintains its charge.

Between time t4<t<t5, switches S20 and S22 remain in their respective first positions and switch S24 remains open. The same phenomenon takes place as between time t0–t1, apart from the fact that the node 27 is no longer VSS but is brought to the VPP value.

At time t5, switches S20 and S22 switch from their respective first positions to their respective second positions as described above for time t1.

Between time t5<t<t6, with switches S20 and S22 in their respective second positions and switch S24 open, capacitors C20 and C24 are now connected in series again. This series connection of capacitors C20 and C24 is connected in parallel with capacitor C22 as described above for time t1<t<t2. However, during this time interval capacitor C24 is charged to the voltage given by equation 3, i.e. VPP so that capacitor C24 elevates the negative plate of capacitor C20 to this voltage value. The pumping or elevation effect is that the negative plate 28 of capacitor C20 is always referenced to the previous programming voltage VPP when switches S20 and S22 are in their respective second positions. Stated in more general terms, the input sampling capacitor C20 always has a negative plate 28 referenced either to the ground, or by the output elevation capacitor C24, to the current value of the output voltage VPP such that the input voltage Vcc is added to the current output voltage VPP.

At time t6, switches S20 and S22 switch from their respective second positions back to their respective first positions and switch S24 remains open as described above for time t2.

Between time t6<t<t7: switches S20 and S22 are in their respective first positions, switch S24 is open and all three capacitors C20, C22, C24 are physically isolated from each other. The positive plate 25 of capacitor C20 recharges to the voltage value Vcc.

At time t7 switch S24 closes and connects the output terminal 29 of the voltage follower 22 to the positive plate 27 of capacitor C24 as described above for time t3, and so on.

FIG. 2c illustrates the timing relationship of the respective control signals Φ1, Φ2 and Φ3 of the respective switches S20, S22 and S24 as described in relation to FIGS. a and 2b. The duration of a cycle is from time t1 to time t5.

It should be noted from FIG. 2c that it is not mandatory to include switch S24. It could in theory be replaced by a short circuit if switches S20 and S22 are controlled such that switch S20 is never in its first position when switch S22 is in its second position (and vice versa). Although it may lead to an unstable circuit in certain cases, it could work in an appropriately designed circuit.

FIG. 3a illustrates a circuit embodying the digital ramp generator of FIG. a. This circuit uses six n-type CMOS transistors MN1–MN6, a diode D and the three capacitors C20, C22 and C24.

Referring to transistor MN1, its source terminal represents node 23 and is connected preferably to a voltage supply $V_z$. The voltage $V_z$ may be produced by the circuit of FIG. 3b. Other circuits for producing $V_Z$ may be substituted by those skilled in this art. The value of $V_z$ is of the order of Vcc but it is pulsed. The drain terminal of MN1 represents node 25 and is connected to the positive plate of capacitor C20. Referring to transistor MN2, its drain terminal represents node 25 and its source terminal represents node 24 which is connected to the positive plate of capacitor C22. Transistors MN1 and MN2 are connected and controlled such that they represent the switch S20 of FIG. a. The respective gate terminals of transistors MN1 and MN2 are controlled by the respective control signals Φ1 and NΦ1. The signal NΦ1 is the inverse signal of Φ1. They may be generated by the circuit of FIG. 3c. Other circuits for producing complementary signals Φ1 and NΦ1 may be substituted by those skilled in this art.

Referring to transistor MN3, its drain terminal represents node 28 and is connected to the negative plate of capacitor C20, its source terminal represents node 26 and is connected to the negative voltage terminal VSS. Referring to transistor MN4, its source terminal represents node 28 and its drain terminal represents node 27 which is connected to the positive plate of capacitor C24. Transistors MN3 and MN4 are connected and controlled such that they represent the switch S22 of FIG. a. The respective gate terminals of transistors MN3 and MN4 are controlled by the respective control signals Φ2 and NΦ2. The signal NΦ2 is the inverse signal of Φ2. They too may be produced by the circuit of FIG. 3c or a suitable substitute.

Transistor MN5 is connected and controlled such that it represents the voltage follower 22 of FIG. a. Referring to transistor MN5, its drain terminal is connected, via the diode D, to node 25, i.e. the positive plate of capacitor C20. Its gate terminal is connected to node 24, i.e. the positive plate of capacitor C22, and its source terminal represents node 29. Its drain terminal is connected to an HI-V node. The diode D is embodied as a direct diode-connected N-type CMOS transistor whose anode, which is connected to node 25, is formed by connecting the gate and drain terminals together, the cathode of this diode, i.e. the source terminal, is connected to the drain terminal of transistor MN5 and to node HI-V. It is preferable to include this diode D as it prevents any overvoltage occurring at node 25 which can be caused by the elevation effect.

Transistor MN6 is connected and controlled such that it represents the switch S24 of FIG. a. Referring to transistor MN6, its drain terminal is connected to the source terminal 29 of transistor MN5, its source terminal is connected to the positive plate 24 of capacitor C24 and its gate terminal is controlled by the control signal Φ3.

The control signals Φ1, NΦ1, Φ2, NΦ2 and Φ3 are preferably derived from circuits that are supplied from the high voltage HI-V, as described hereinafter.

It should be noted that transistors MN1–MN6 are symmetrical CMOS transistors and their respective drain and source terminals may be respectively interchanged. Furthermore, it is preferable that the transistors MN2 and MN5 be native n-type MOS transistors, that is to say, transistors that have had no gate threshold voltage (Vth) adjustment and, as a result a weak conduction threshold.

FIG. 3b shows a circuit preferably used to produce a voltage at a constant value $V_z$. Since the summation of a series of identical electrical charges on capacitor C22 is fundamental to a linear ramp signal, the sampling capacitor C20 has preferably to be supplied by a constant voltage. As shown, the $V_z$ supply is produced by a Zoner diode DZ, connected between a HI-V voltage node and a VSS voltage node, in series with an MP6 p-type CMOS transistor. However, such a circuit being current consuming, it is preferable to have it gated by a cyclical signal VE. The signal VE authorises the conduction of the MP6-DZ circuit only when C20 is to be charged: when switches S20 and S22 go to their first position.

Typically, this conduction takes place during 3 ps each 16 ps. The conduction is organized through a current mixer comprising transistor MP6 in the branch of diode DZ and a transistor MP5 in a branch further comprising a series of two n-type MOS transistors MN12 and MN13. Transistor MN12 is used for gating the conduction of diode DZ by receiving VE signals on its gate. The transistor MP5 has its gate connected to the gate of transistor MP6 and to its own drain. Transistor MP5 acts as a current generator whose value is fixed by a constant voltage Vref appearing on the gate of transistor MN13. The constant voltage Vref is itself produced by a classic WILSON mirror comprising MP1–MP4 p-type CMOS transistors and MN10, MN11 and MN14 n-type CMOS transistors. This WILSON mirror is itself gated by a VF signal being applied to the gate of the copying transistor MP1 and MP2. When there is no necessity for a VPP voltage, VF is at $V_z$ and transistors MP1 and MP2 are off. When VPP is required, VF is set to VSS. Having a stable Vref voltage which drives a circuit which itself provides a $V_z$ stable voltage, permits the DZ diode to operate with a small reverse current, without suffering the drawback of variation of the DZ voltage when the small reverse current varies.

FIG. 3c represents a high voltage inverter circuit for generating the high voltage control signals Φx and NΦx. In the circuit of the illustrated embodiment, two circuits of that kind are used for driving switches S20 and S24 respectively.

The represented high voltage inverter 400 comprises: a cross-coupled stage 410; a cascode stage 420; and a switching stage 430. It provides complementary high voltage signals Φx, NΦx.

The cross-coupled stage 410 is connected to the voltage HI-V and provides two high voltage complementary output signals OUT and NOUT on its respective output terminals 440 and 450. The cross-coupled stage 410 comprises two cross-coupled p-type MOS transistors MP40 and MP41 whose sources are connected to the voltage HI-V. The gate of transistor MP40 is connected to the drain 440 of transistor MP41 and the gate of transistor MP41 is connected to the drain 450 of transistor MP40.

Two respective inputs of the cascode stage 420 are connected to the respective outputs 440 and 450 of the cross-coupled stage 410. The cascode stage 420 outputs the high voltage complementary control signals Φx and NΦx on its respective terminals 460 and 470. The cascode stage 420 comprises two p-type MOS transistors MP42 and MP43 whose source terminals are respectively connected to the drain terminals of transistors MP40 and MP41 and whose gate terminals are biased via a terminal 480 at the reference voltage Vref1.

Vref1 is equal to HI-V minus about 5 volts. The drains of MOS transistors MP40 and MP41 of stage 410 are thus biased so as to not be too low. That limits the commutation current and thus increases efficiency, which is desirable because the voltage source HI-V has a relatively small fan-out compared to other supply voltages used.

Two respective input terminals of the switching stage 430 are connected to the respective output terminals 460 and 470 of the cascode stage 420. The switching stage 430 is controlled, via a third input terminal 490, by an input control signal VC or VD (according to the Φ1 or Φ2 signals to be produced) and is connected to the voltage source VSS. The voltage levels of the input control signals VC or VD are preferably derived from the voltage source Vcc.

The switching stage 430 comprises two n-type MOS transistors MN40 and MN41 and an inverter INV1, preferably a CMOS inverter. The drain terminals of transistors MN40 and MN41 are respectively connected to the source terminals of transistors MP42 and MP43. The control signals VC or VD are applied to the gate terminal of transistor MN40 and to the input terminal of inverter INV1. The gate terminal of transistor MN41 is connected to the output terminal 495 of inverter INV1. A high voltage supply line of inverter INV1 is connected to the voltage source Vcc, whilst a low voltage supply line of inverter INV1 is connected to voltage source VSS.

Since the operation of the high voltage inverter circuit 400 is symmetrical, only its operation with a steady state logic high, i.e. a voltage level of Vcc, present on the gate terminal 490 of transistor MN40 will be considered, as the inverse case is easily deduced by one skilled in the art.

Therefore, transistor MN40 is conducting whilst transistor MN41 is not conducting. Thus, transistor MN40 pulls the drain terminal 470 of transistor MP42 down to a voltage level of approximately VSS. Since transistor MP42 (and indeed transistor MP43) is gated by Vref1 via terminal 480, it is conducting, which results in the node 450 being pulled down to a voltage level of approximately VPP−Vref1+Vtp. The Vtp supplement is due to the fact that the wells in which transistors P, MP40 and MP43 are manufactured are brought to HI-V. Due to the fact that the respective drain and gate terminals of the respective transistors MP40 and MP41 are cross-coupled, the action of pulling down one of the gates of either of these transistors causes the other to be pulled up, thus complementary signals OUT and NOUT are provided. In this particular embodiment, the control signal Φx is at a voltage level of approximately VPP, whilst the control signal NΦx is at a voltage level of approximately VSS. Signals Φx and NΦx are in phase opposition while signal Φx and VC or VD are in phase.

From FIG. 3a, it can be seen that the control signal NΦ2 can be the control signal Φ1 and the control signal NΦ1 can be the control signal Φ2. Thus, these four control signals Φ1, NΦ1, Φ2, NΦ2 can be derived from one voltage level converter circuit; control signal Φ3 being derived from another high voltage inverter. Alternatively, the control signals Φ1, NΦ1 and Φ2, NΦ2 can be derived from different high voltage inverters. Furthermore, it is possible that transistor MN6 of FIG. 3 can be controlled by the control signal Φ2 (or NΦ1) instead of Φ3.

FIG. 4 shows timing diagrams of signals VC, VD, VE and VF presented above. VF is low when a VPP output is to be produced as a ramp. VE, which triggers the conduction of DZ, is active at the end of an active pulse VD, which itself triggers the switches S20 and S22. Thus when VD is active, and as soon as VE becomes active, the C20 capacitor is charged. Thereafter, when VD is low, VC rises to an active voltage. A high voltage corresponding to VC is applied to MN6 acting as switch S24. On an active VC level, S24 is on.

FIG. 5 represents a block diagram of a control signal generator 500 that is used to generate the signals of FIG. 4. The generator 500 includes an oscillator 510, a counter 520 and a decoder 530.

The oscillator 510 drives the counter 520 and the decoder 530 receives from the counter 520 a plurality of input signals I1-In and the decoder 530 outputs a plurality of control signals VC-VF that have the appropriate timing relationships. The decoder 530 and counter 520 are known to those skilled in the art.

The operation of the digital ramp generator can be controlled by a START/STOP signal (not shown) that is received by the counter 520.

Therefore, provided that the output of the oscillator 510 is stable, the rate of change of the programming voltage VPP, i.e. dVPP/dt, will only be dependant upon the ratio of the capacitors C20 and C22, i.e. C20/C22, which is an area ratio that can be precisely controlled. As a result of this dependence upon the area ratio of capacitors C20 and C22, the digital ramp generator according to the invention is independent of any process, temperature and supply voltage (VCC) variations and the programming voltage VPP at the output 24 of the digital ramp generator is substantially linear.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A digital ramp generator comprising:
a controlled sampling circuit that receives a input voltage and produces a sampled voltage;
an adding circuit for adding said sampled voltage to an actual output voltage of said generator and for providing a new voltage that is greater than said input voltage; and
a voltage follower circuit, receiving said new voltage and said actual output voltage of said generator and providing an other output voltage of said generator.

2. A generator according to claim 1, further comprising:
in the voltage follower circuit, a voltage follower supplied by a high voltage, and
a first switch having an input terminal that is connected to an output terminal of the voltage follower and the first switch having a base terminal;
a first capacitor connected between said base terminal of said first switch and a reference voltage terminal;

a second switch having a first terminal connected to an input terminal of said generator, a second terminal connected to an input of said voltage follower circuit and a common third terminal connected to a first plate of a second capacitor;

a third switch having a first terminal connected to a reference voltage terminal, a second terminal connected to said base terminal of the first switch and a common third terminal connected to a second plate of said second capacitor; and a third capacitor being connected between said second terminal of said second switch and a reference voltage terminal.

3. A generator according to claim 2, further comprising: a circuit for the switching of said second and third switches from their respective first terminals to their respective second terminals substantially in unison.

4. A generator according to claim 3, further comprising: a circuit which closes said first switch after said second and third switches have switched to their respective second terminals and which opens said first switch before said second and third switches switch to their respective first terminals.

5. A generator according to claim 2, wherein said voltage follower circuit includes a MOS transistor comprising:
a drain terminal connected to said high voltage;
a source terminal connected to the output terminal of said generator; and
a gate terminal that receives said new voltage.

6. A generator according to claim 5, said voltage follower circuit further comprising:
a diode whose anode is connected to said common third terminal of said second switch and whose cathode is connected to said drain terminal of said MOS transistor.

7. A generator according to claim 6, wherein said diode is implemented using a MOS transistor.

8. A generator according to claim 2, wherein said second and third switches are implemented using n-type MOS transistors.

9. A generator according to claim 2, wherein said second capacitor is less than said third capacitor and that said third capacitor is less than said first capacitor.

10. A generator according to claim 2, which is implemented on a single semiconductor substrate.

11. A circuit according to claim 2, wherein said second and third switches are implemented using appropriately connected and controlled n-type MOS transistors.

12. A circuit according to claim 2, wherein said second capacitor is less than said third capacitor and that said third capacitor is less than said first capacitor.

13. A circuit according to claim 1, further comprising:
a memory device programmed by said actual output voltage.

14. A circuit according to claim 1, further comprising a smart card chip programmed by said actual output voltage.

15. A ramp generator having an output carrying a ramp voltage, the ramp generator further having inputs receiving an input voltage, a high voltage, and a reference voltage, the input voltage and the high voltage referenced to the reference voltage, the ramp generator comprising:
means for sampling the input voltage, producing an output carrying a sampled input voltage;
means having an output connected to the ramp generator output, for adding to the sampled input voltage a current value of the ramp voltage, thereby producing a new value of the ramp voltage at the ramp generator output;
means for cyclically controlling the means for sampling and the means for adding such that each cycle increases the ramp voltage by an equal value.

16. The ramp generator of claim 15, wherein:
the cycles each have substantially equal durations, thereby producing a substantially linear ramp voltage.

17. The ramp generator of claim 15, the means for sampling further comprising:
a first sampling capacitor; and
a first cyclically operated switch connecting one plate of the first sampling capacitor to the input voltage for a first predetermined time during each cycle and to an output terminal for a second predetermined time during each cycle.

18. The ramp generator of claim 17, the means for adding further comprising:
a second sampling capacitor having one plate connected to the output terminal of the first cyclically operated switch;
a voltage follower having an input connected to the one plate of the second sampling capacitor and an output producing the ramp voltage;
a third sampling capacitor having one plate connected to receive a sample of the ramp voltage; and
a second cyclically operated switch connecting the third sampling capacitor to a second plate of the first sampling capacitor during the second predetermined time during each cycle.

19. The ramp generator of claim 18, the means for adding further comprising:
a third cyclically operated switch connecting the one plate of the third sampling capacitor to the output of the voltage follower for a third predetermined time entirely within the first predetermined time during each cycle.

20. The ramp generator of claim 19, wherein the first and second cyclically operated switches are each comprised of two MOS transistors having gates connected to complementary driving signals, and the third cyclically operated switch is comprised of one MOS transistor.

21. A method of producing a step-wise substantially linear ramp signal, comprising the steps of:
producing a ramp signal output voltage;
sampling an input signal voltage;
adding to the ramp signal output voltage the sampled input signal voltage, thereby producing a new ramp signal output voltage; and
setting the ramp signal output voltage equal to the new ramp signal output voltage.

22. A method according to claim 21, of programming an integrated circuit, further comprising the steps of:
supplying the step-wise substantially linear ramp signal to a programming node of the integrated circuit.

23. A circuit for programming an integrated circuit using a ramp voltage, comprising:
a controlled sampling circuit that receives an input voltage,
an adding circuit for adding said input voltage to the ramp voltage and for providing a new ramp voltage that is a sum of said input voltage and the ramp voltage;
a voltage follower means, receiving said new ramp voltage and providing as the ramp voltage a voltage equal to said new ramp voltage; and
a programming node in the integrated circuit connected to receive the ramp voltage.

24. A circuit according to claim 23, further comprising:

in the voltage follower means, a voltage follower circuit supplied by a high voltage, and a first switch having an input terminal that is connected to an output terminal of the voltage follower circuit and an output terminal;

a first capacitor connected between said output terminal of said first switch and a reference voltage terminal; and second and third switches and second and third capacitors;

said second switch having a first terminal connected to an input terminal of said generator, a second terminal connected to an input of said voltage follower circuit and a common third terminal connected to one plate of said second capacitor;

said third switch having a first terminal connected to a reference voltage terminal, a second terminal connected to said output of said voltage follower circuit and a common third terminal connected to a second plate of said second capacitor; and said third capacitor being connected between said second terminal of said second switch and said reference voltage terminal.

25. A circuit according to claim 24, further comprising:

a circuit for the switching of said second and third switches from their respective first terminals to their respective second terminals substantially in unison.

26. A circuit according to claim 25, further comprising:

a circuit which closes said first switch after said second and third switches have switched to their respective second terminals and which opens said first switch before said second and third switches switch to their respective first terminals.

27. A circuit according to claim 23, wherein said voltage follower circuit includes a MOS transistor comprising:

a drain terminal connected to said high voltage;

a source terminal connected to the output terminal of said generator; and a gate terminal that receives said new voltage.

28. A circuit according to claim 27, said voltage follower circuit further comprising:

a diode whose anode is connected to said common third terminal of said second switch and whose cathode is connected to said drain terminal.

29. A circuit according to claim 28, wherein said diode is implemented using a MOS transistor.

* * * * *